(12) United States Patent
Seddon

(10) Patent No.: US 11,114,343 B2
(45) Date of Patent: Sep. 7, 2021

(54) PARTIAL BACKSIDE METAL REMOVAL SINGULATION SYSTEM AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/505,646

(22) Filed: Jul. 8, 2019

(65) Prior Publication Data

US 2020/0243389 A1 Jul. 30, 2020

Related U.S. Application Data

(60) Provisional application No. 62/796,645, filed on Jan. 25, 2019.

(51) Int. Cl.
| | |
|---|---|
| *H01L 21/00* | (2006.01) |
| *H01L 21/78* | (2006.01) |
| *H01L 21/268* | (2006.01) |
| *H01L 21/3205* | (2006.01) |
| *H01L 21/3213* | (2006.01) |
| *H01L 21/324* | (2006.01) |
| *H01L 23/544* | (2006.01) |
| *H01L 21/66* | (2006.01) |
| *H01L 21/3065* | (2006.01) |

(52) U.S. Cl.
CPC ............ *H01L 21/78* (2013.01); *H01L 21/268* (2013.01); *H01L 21/3065* (2013.01); *H01L 21/3247* (2013.01); *H01L 21/32051* (2013.01); *H01L 21/32131* (2013.01); *H01L 22/20* (2013.01); *H01L 23/544* (2013.01); *H01L 2223/5446* (2013.01)

(58) Field of Classification Search
CPC ... H01L 21/78; H01L 21/268; H01L 21/3065; H01L 21/32051; H01L 21/32131; H01L 21/3247; H01L 22/20; H01L 23/544
See application file for complete search history.

(56) References Cited

U.S. PATENT DOCUMENTS

| | | | | |
|---|---|---|---|---|
| 5,259,149 A * | 11/1993 | Klievoneit | ................ | B24B 1/00 451/57 |
| 9,018,079 B1 * | 4/2015 | Lei | .......................... | H01L 21/78 438/462 |
| 9,224,650 B2 * | 12/2015 | Lei | .......................... | H01L 21/78 |
| 2011/0100967 A1 * | 5/2011 | Yoo | ....................... | B23K 26/032 219/121.73 |
| 2013/0337634 A1 * | 12/2013 | Hua | ........................ | H01L 21/78 438/465 |

* cited by examiner

*Primary Examiner* — Richard A Booth
(74) *Attorney, Agent, or Firm* — Adam R. Stephenson, Ltd.

(57) ABSTRACT

Implementations of methods of singulating a plurality of die included in a substrate may include forming a plurality of die on a first side of a substrate, forming a backside metal layer on a second side of a substrate, forming a groove only partially through a thickness of the backside metal layer, and singulating the plurality of die included in the substrate through removing backmetal material in the die street and removing substrate material in the die street. The groove may be located in a die street of the substrate.

20 Claims, 3 Drawing Sheets

PARTIAL BACKSIDE METAL REMOVAL SINGULATION SYSTEM AND RELATED METHODS

CROSS REFERENCE TO RELATED APPLICATIONS

This application claims the benefit of the filing date of U.S. Provisional Patent Application 62/796,645, entitled "PARTIAL BACKSIDE METAL REMOVAL SINGULATION SYSTEM AND RELATED METHODS" to Seddon et al., which was filed on Jan. 25, 2019, the disclosure of which is hereby incorporated entirely herein by reference.

BACKGROUND

1. Technical Field

Aspects of this document relate generally to die singulation systems and methods. More specific implementations involve methods of singulating semiconductor die from a thinned substrate.

2. Background

Semiconductor devices include integrated circuits found in common electrical and electronic devices, such as phones, desktops, tablets, other computing devices, and other electronic devices. The devices are separated through singulating a wafer of semiconducting material into a plurality of semiconductor die. Various layers may be coupled to the front side and/or the backside of the wafer. Upon singulation, the die can be mounted on a package and electrically integrated with the package which may then be used in the electrical or electronic device.

SUMMARY

Implementations of methods of singulating a plurality of die included in a substrate may include forming a plurality of die on a first side of a substrate, forming a backside metal layer on a second side of a substrate, forming a groove only partially through a thickness of the backside metal layer, and singulating the plurality of die included in the substrate through removing backmetal material in the die street and removing substrate material in the die street/scribe grid/saw street. The groove may be located in a die street of the substrate.

Implementations of methods of singulating a plurality of die included in a substrate may include one, all, or any of the following:

The method may include thinning the second side of the substrate.

The groove may be formed using a laser beam.

The groove may be formed using a saw blade.

Removing the backmetal material in the die street and removing the substrate material in the die street may include using a laser beam.

Removing backmetal material in the die street and removing substrate material in the die street may include using a saw blade.

Singulating the plurality of die included in the substrate may include removing substrate material in the die street through plasma etching from the first side of the die and removing a remaining material of the thickness of the backmetal in the die street through jet ablation.

The method may include remote plasma healing a sidewall of the die.

The method may include monitoring the formation of the groove using a camera facing the second side of the substrate.

Implementations of methods of singulating a plurality of die included in a substrate may include forming a groove into a first thickness of a backside metal layer in a die street. The backside metal layer may be coupled to a substrate. The method may include etching the backside metal layer. The etch may expose the substrate in the die street and/or may thin the backmetal layer to a second thickness. The method may include singulating a plurality of die included in the substrate through removing a substrate material in the die street.

Implementations of methods of singulating a plurality of die included in a substrate may include one, all, or any of the following:

The method may include depositing a diffusion barrier layer, an adhesion layer, or any combination thereof between the backside metal layer and the substrate.

The diffusion barrier layer, adhesion layer, or any combination thereof may serve as an etch stop.

Removing substrate material in the die street may be done using one of a laser beam or a saw blade.

Removing substrate material in the die street may include plasma etching.

The method may include remote plasma healing of a sidewall of each die of the plurality of die.

Implementations of methods of singulating a plurality of die included in a substrate may include forming a plurality of die on a first side of a substrate, thinning a second side of the substrate, forming a backside metal layer on the second side of a substrate, forming a groove partially through a first thickness of the backside metal layer in a die street, and etching the backside metal layer. The etch may expose a portion of the substrate in the die street and/or may thin the backmetal layer to a second thickness. The method may also include singulating the plurality of die included in the substrate through plasma etching at the portion of the substrate exposed by the etching.

Implementations of methods of singulating a plurality of die included in a substrate may include one, all, or any of the following:

The method may include thinning the second side of the substrate and the substrate may be thinned to less than 50 micrometers.

The backside metal layer may be thinned to 10 micrometers.

The groove may be formed using a laser beam.

The method may include monitoring the formation of the groove using a camera facing the second side of the substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended partial backside metal removal die singulation system and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such partial backside metal removal die singulation system and related methods, and implementing components and methods, consistent with the intended operation and methods.

Figure 1:
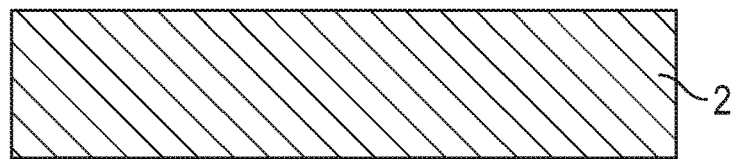
FIG. 1 is a cross sectional side view of a portion of a substrate.

Referring to FIG. 1, a cross sectional side view of a portion of a substrate 2 is illustrated. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 2 may include a substrate material such as, by non-limiting example, single crystal silicon, silicon dioxide, glass, gallium arsenide, sapphire, ruby, silicon-on-insulator, silicon carbide, polycrystalline or amorphous forms of any of the foregoing, and any other substrate material useful for constructing semiconductor devices. In particular implementations, the substrate may be a silicon-on-insulator substrate.

Figure 2:
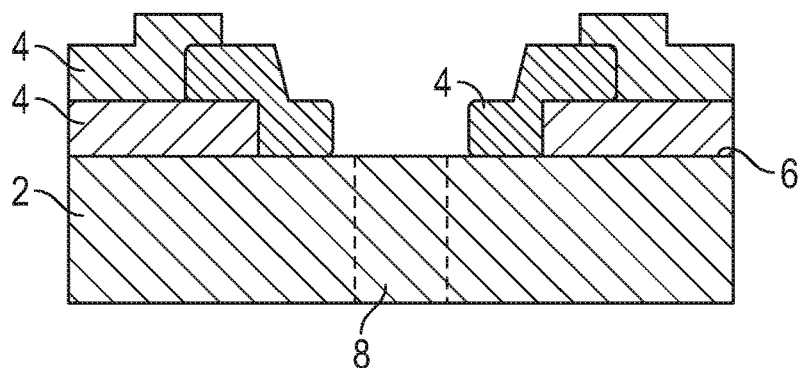
FIG. 2 is a cross sectional side view of a plurality of layers coupled to a first side of the substrate of FIG. 1.

Referring to FIG. 2, a cross sectional side view of a plurality of layers coupled to a first side of the substrate of FIG. 1 is illustrated. In various implementations, before singulating a plurality of die from the substrate 2, the method of forming a plurality of die may include forming a plurality of die on the substrate. This may include forming a plurality of layers 4 on a first side 6 the substrate 2. As illustrated by FIG. 2, the plurality of layers 4 may be patterned, and in various implementations, may be patterned (or otherwise removed) to not be present over a die street/scribe grid/saw street 8 in the substrate 2. The plurality of layers may include, by non-limiting example, one or more metal layers, one or more passivation layers, any other layer, and any combination thereof. In various implementations passivation layers may include, by non-limiting example, silicon nitride, oxides, metal electrical test structures, electrical test pads, silicon dioxide, polyimides, metal pads, residual underbump metallization (UBM), any combination thereof, and any other layer or material capable of facilitating electrical or thermal connection between the one or more semiconductor die and/or protecting the one or more semiconductor die from contaminants. In various implementations, the plurality of die may include power semiconductor devices, such as, by non-limiting example, a MOSFET, an IGBT, or any other power semiconductor device. In other implementations, the plurality of die may include non-power semiconductor devices.

Figure 3:
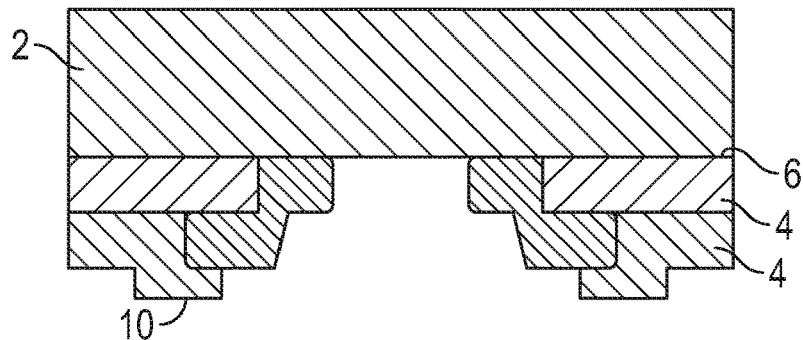
FIG. 3 is a view of the substrate and plurality of layers of FIG. 2 in a flipped orientation.
Figure 4:
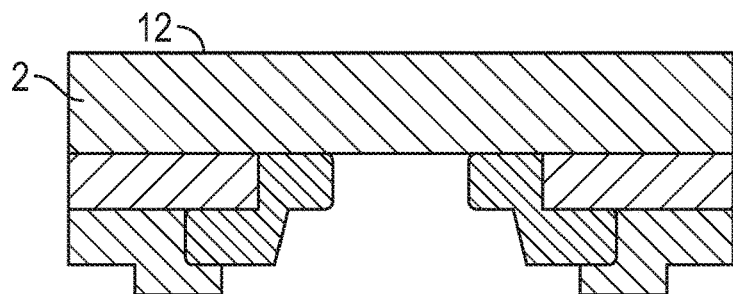
FIG. 4 is a view of the substrate and plurality of layers of FIG. 3 with the substrate thinned.

Referring to FIG. 3, a view of the substrate and plurality of layers of FIG. 2 in a flipped orientation is illustrated. The method of forming and singulating a plurality of die includes flipping the substrate and, though not illustrated, in various implementations, the method may include applying a tape to a first side 10 of the plurality of layers 4. Such a tape may be a backgrind tape. Referring to FIG. 4, a view of substrate and plurality of layers of FIG. 3 with the substrate thinned is illustrated. In various implementations, the method of forming and singulating a plurality of die may include thinning the second side 12 of the substrate 2. In various implementations, the substrate 2 may be thinned to a thickness less than 50 micrometers (μm). In other implementations, the substrate 2 may be thinned to a thickness less than 30 μm. In still other implementations, the substrate 2 may be thinned to a thickness less than 100 μm, more than 100 μm, and in other various implementations, the substrate 2 may not be thinned. In particular implementations, the substrate 2 may be thinned to a thickness of about 25 μm, and in other particular implementations, the substrate may be thinned to a thickness of about 75 μm. The substrate 2 may be thinned through backgrinding, etching, or any other thinning technique. In particular implementations, the substrate is thinned using a backgrinding process marketed under the trade name TAIKO by DISCO of Tokyo, Japan to form an edge ring that supports the wafer.

Figure 5:
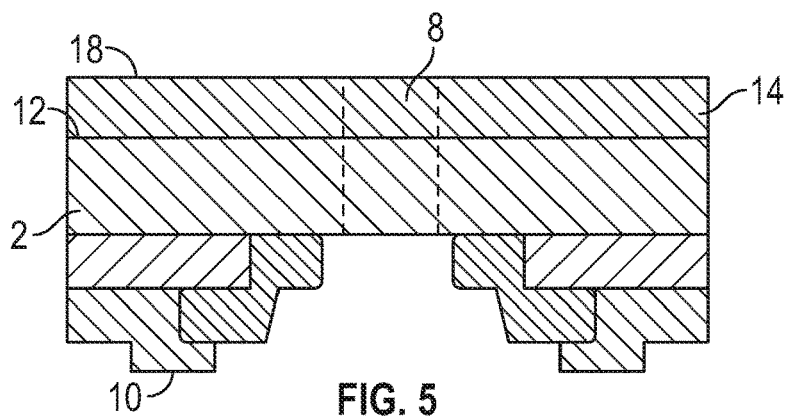
FIG. 5 is a view of the thinned substrate and plurality of layers of FIG. 4 with a backside metal layer coupled to the second side of the substrate.

Referring to FIG. 5, a view of the thinned substrate and plurality of layers of FIG. 4 with a backside metal layer coupled to the second side of the substrate is illustrated. The method of forming a plurality of die and singulating the plurality of die includes forming a backside metal layer 14 on the second side 12 of the substrate 2. In particular implementations, the backside metal layer 14 may be copper or a copper alloy. In other implementations, the backside metal layer may include any other type of metal, alloy thereof, or combination thereof. In various implementations, the backside metal layer 14 may be 10 μm thick. In other implementations, the backside metal layer may be more or less thick than 10 μm, and in particular implementations, the backside metal layer 14 may be about 15 μm thick. The backside metal layer 14 may be evaporated onto the substrate 2, however, in other implementations (including implementations having thicker substrates), the backside metal layer 14 may be plated onto the substrate 2 or formed on the substrate using another technique. In various implementations, the backside metal layer 14 may be formed over the entire second side 12 of the substrate 2. In such implementations, the backside metal layer 14 may strengthen the substrate 2.

Prior to any actual singulation of a plurality of the die, the method of singulating the plurality of die in the substrate may include aligning the substrate. In various implementations, the method may include aligning the substrate from the first side (which may be the front side, or bottom side as oriented in FIG. 5) using optics or a camera. In such implementations, the optics or camera may be placed below the substrate and may detect a plurality of alignment features formed on or within the substrate. In various implementations, the alignment features may be formed on or within the die street 8 of the substrate. In various implementations having tape coupled to the first side 10 of the plurality of layers, the optics or camera may be configured to detect the plurality of alignment features through the tape. In a particular implementation, the substrate may be aligned using an infrared (IR) camera and IR reflective/emittive alignment features. In other implementations, the alignment features may be included on an outer surface 18 of the backside metal layer 14. In such implementations, rather than using optics or a camera below the substrate, the optics or camera may align the substrate from above the substrate (as oriented in FIG. 5). In still other implementations where the substrate includes a ring around the perimeter after thinning the substrate, the method of aligning the substrate may include placing alignment features in the periphery of the substrate and grinding down the perimeter ring. The substrate may then be aligned from the backside, or second side 12 of the substrate by using the alignment features along the outer edge of the device. Such an alignment method may include using IR spectroscopy.

Figure 6:
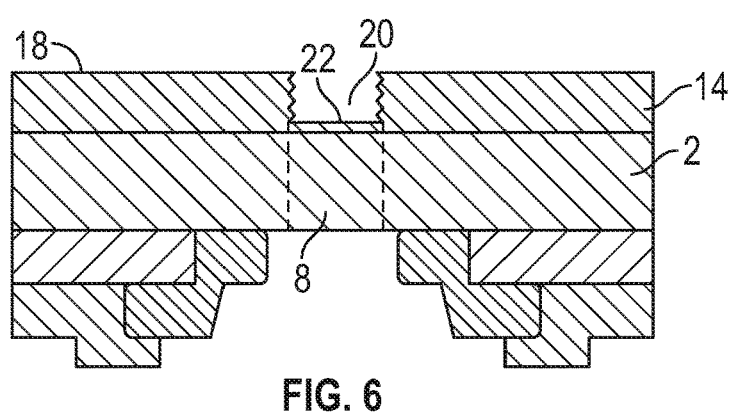
FIG. 6 is a view of the backside metal layer of FIG. 5 having a groove formed therein.

Referring to FIG. 6, a view of the backside metal layer of FIG. 5 having a groove formed therein is illustrated. Upon aligning the substrate, the method of singulating a plurality of die in the substrate 2 includes forming a groove 20 only partially through/partway through a thickness of the backside metal layer 14. In such implementations, a portion 22 of the backside metal layer 14 may remain between the groove 20 and the substrate 2. In this manner, the formation of the groove is prevented from extending into the substrate 2, and in turn, may prevent damage to the substrate through forming the groove into the substrate. In various implementations, the portion 22 may have a thickness of about 1 μm, while in other implementations the portion 22 may have a thickness of more than or less than 1 μm. The groove 20 is located in the die street 8. In various implementations, the groove 20 may be as wide as the die street 8 or wider than the die street. The groove 20 may be formed through, by non-limiting example, a laser beam, a saw blade, a scribe, or through jet ablation. In other implementations, the groove 20 in the backside metal layer 14 may be formed through applying a photo-mask to the outer surface 18 of the backside metal layer 14 and partially etching the groove 20 into the backside metal layer 14. Where a laser is used, not forming the groove into the substrate material may reduce the amount of slag containing substrate material that is deposited on the backside metal layer during processing.

In order to ensure that the formation of the groove leaves the portion 22 between the groove 20 and the substrate 2, care may be required to prevent the formation of the groove into the substrate, especially in implementations where the portion 22 is 1 μm thick or less than 1 μm thick. This is in part because the thickness of the tape on which the substrate is mounted can often vary by 5 microns or more across the substrate due to variations in adhesive thickness and tape thickness.

In order to facilitate the formation of the groove 20 not extending entirely through the backside metal layer 14, in various implementations the method of singulating a plurality of die in a substrate may include actively monitoring the formation of a groove 20 in the backside metal layer 14. In various implementations, a camera facing the backside metal layer 14 may be used to actively monitor the formation of the groove 20. Active monitoring may include monitoring the cleared backside metal and/or measuring the thickness variation of the removed backside metal layer as compared to the original thickness of the backside metal layer. In such implementations, the method for singulating the plurality of die may include making near-real-time adjustments to one or more laser or saw parameters based upon data collected during the active monitoring of the formation of the groove 20. In particular implementations, near-real-time may include the camera monitoring the formation of the groove one inch behind the laser beam or saw blade (or other element forming the groove, such as a scribe or water jet), and, based upon the data collected from the monitoring, immediately making adjustments to the parameters of the laser beam or saw blade. In other implementations, near-real-time may include the camera actively monitoring the formation of the groove less than one inch behind the laser beam or saw blade or more than one inch behind the laser beam or saw blade.

The parameters of the laser beam which may be adjusted may include, by non-limiting example, laser power, pulse width, pulse energy, repetition rate, focal depth, focal point, and/or speed of movement of the laser beam across the backside metal layer 14. Similarly, if a saw blade, scribe, or water jet is used to form the groove 20, parameters of the saw blade, scribe, or water jet, such as speed or depth of the saw blade, speed or pressure of the scribe, or speed or pressure of the water jet may be adjusted to prevent forming the groove through an entire thickness of the backside metal layer 14. In various implementations, especially implementations having a thinned substrate, active monitoring of the formation of the groove 20 may be critical as the process window for forming the groove may be more narrow. Through such active monitoring and near-real-time adjustments, any tilt in the substrate or chuck and any variations in the thickness of the tape may be compensated for by adjusting the parameters of the laser or other groove forming mechanism. In this manner, the backside metal layer 14 may have a groove 20 formed nearly entirely through the thickness of the backside metal layer without the groove being formed into the substrate 2 or entirely through the backside metal layer 14.

Figure 7:
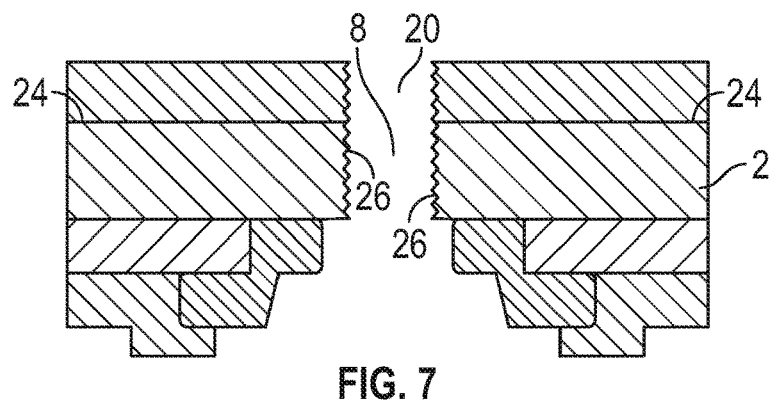
FIG. 7 is a view of the substrate of FIG. 6 singulated into a plurality of die.

Referring to FIG. 7, a view of the substrate of FIG. 6 singulated into a plurality of die is illustrated. The method of singulating a plurality of die 24 in a substrate 2 includes singulating the plurality of die in the substrate through removing the portion 22 of the backside metal material 14 in the die street 8 and removing the substrate material of the substrate 2 in the die street 8. As illustrated by FIG. 7, the plurality of die 24 are singulated from the backside of the substrate. Because of this, there is no need to flip the substrate over in order to singulate the substrate from the front side. The ability to singulate the die from the backside may reduce damage to the substrate, and especially a thinned substrate, as it requires the substrate to be handled less and may correspondingly increase yield. Further, in implementations where the plurality of die 24 are singulated from the backside through laser ablation (as disclosed later herein), because it is singulated from the backside and not the front side, re-deposition of the backmetal layer may be reduced as residual backmetal may more easily flow away from the sidewalls of the die.

In various implementations, the plurality of die 22 may be singulated through removing the substrate material of the substrate 2 in the die street 8 with a laser beam or a saw blade. In implementations where the method of singulating the plurality of die includes forming the groove 20 through laser ablation and singulating the plurality of die 24 using a laser beam, the two-step laser ablation process may prevent re-deposition of the backside metal layer 14 into the substrate 2 as the backside metal layer 14 in the die street 8 will be cleared away prior to the singulation of the plurality of die 24. In various implementations, the width of the removed portion of the substrate 2 in the die street 8 may be the same width as a width of the groove 20. In other implementations, the width of the removed portion of the substrate 2 in the die street 8 may be less wide or wider than the width of the groove 20. In such implementations, a thinner saw blade or narrower laser beam may be used to singulate the die as compared to the width of the laser beam, saw blade, stylus, or jet ablation fluid stream used to form the groove 20 in the backside metal layer 14.

As illustrated by FIG. 7, when singulating the plurality of die 24 using a laser beam or a saw blade, the process results in the production of chips and cracks in the sidewalls 26 of the die street 8 and layers adjacent to the die street. The presence of the cracks and chips has the potential to compromise the reliability of the resulting semiconductor package (and reduce the die strength) if/when the cracks and chips propagate into the device or bulk portions of the semiconductor die. Since the saw process involves the rubbing of the rotating blade against the substrate surface, and the laser process involves the focus of a laser beam on the substrate surface, the chipping and cracking can only be managed through saw or laser processing variables (such as, by non-limiting example, substrate feed speed, blade kerf width, cut depth, multiple saw cuts, blade materials, laser power, pulses of laser, etc.) but not eliminated.

Figure 8:
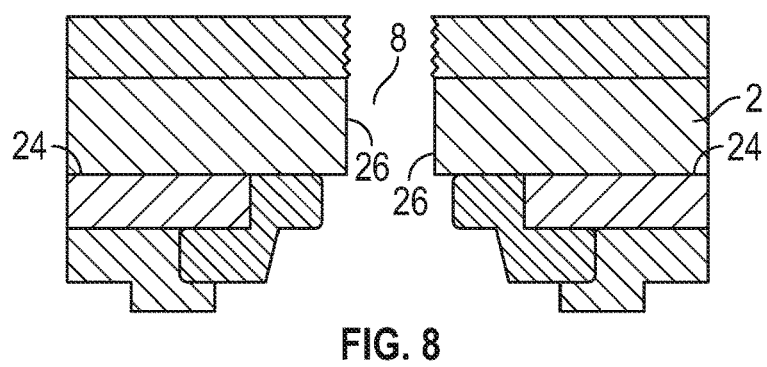
FIG. 8 is a view of the plurality of die of FIG. 7 having smooth sidewalls.

Referring to FIG. 8, a view of the plurality of die of FIG. 7 having smoothed sidewalls is illustrated. In various implementations, the method of singulating the plurality of die may include removing damage from a sidewall 26 of the die street 8 through remote plasma healing. In such implementations, a plasma etch may be applied to the sidewalls 26 of the die street 8, or the sidewalls of the plurality of die 24. The plasma may penetrate/facilitate reaction with the materials of the cracks and/or chips of the sidewalls 26 formed when the plurality of die 24 were singulated from the substrate 2. As the plasma enters the cracks and/or chips, the damaged portion of the substrate 2 may etch away and result in smoothed, or healed, sidewalls 26 of the die street 8, as illustrated by FIG. 8.

In other implementations, rather than singulating the plurality of die 24 from a backside of the substrate, the method of singulating the plurality of die may include flipping the substrate and singulating a plurality of die from the first surface 6 (see FIG. 2) of the substrate. In such implementations, the method may include removing the substrate material in the die street as well as backside metal layer material in the die street from the first surface of the substrate using a laser beam or a saw. In other implementations, the method of singulating a plurality of die may include flipping the substrate and removing substrate material in the die street through plasma etching through the substrate from the first surface 6 (see FIG. 2) of the substrate. In such implementations, a portion of the backside metal layer similar to portion 22 of FIG. 6 may remain after removal of the substrate material in the die street through plasma etching. In such implementations, the portion of the backside metal layer within the die street may be removed through jet ablation, and in turn, the plurality of die may be singulated. In such implementations, the width of the removed substrate material in the die street may be more narrow than the width or the same width of the groove formed by the sawing or laser ablation.

Figure 9:
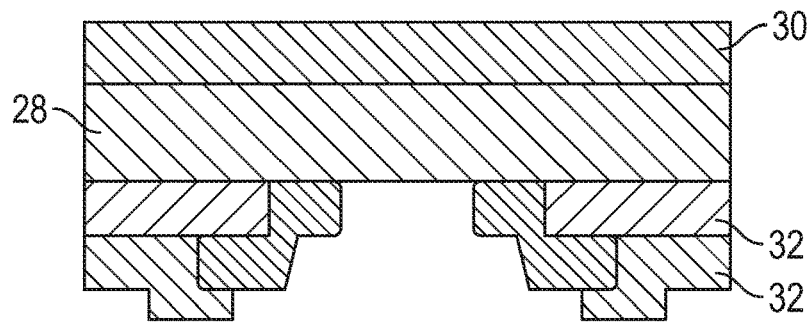
FIG. 9 is a view of a backside metal layer coupled to a substrate.
Figure 10:
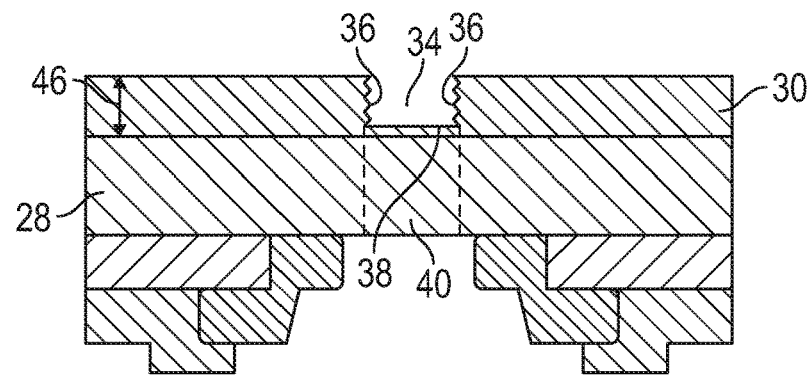
FIG. 10 is a view of the backside metal layer of FIG. 9 having a groove formed therein.

Referring to FIG. 9, a view of a backside metal layer coupled to a substrate is illustrated. The substrate 28 may be the same as or similar to any substrate disclosed herein. Similarly, the backside metal layer 30 may be the same as or similar to any backside metal layer disclosed herein and the plurality of layers 32 may be the same as or similar to any plurality of layers disclosed herein. Likewise, the backside metal layer 30, the plurality of layers 32, and the substrate 28 may be formed using the same or a similar method as any method disclosed herein. The method of singulating a plurality of die may also include aligning the substrate using any alignment technique disclosed herein. Referring to FIG. 10, a view of the backmetal layer of FIG. 9 having a groove formed therein is illustrated. The method of singulating a plurality of die includes forming a groove 34 into a first thickness 46 of the backside metal layer 30 in the die street. The groove 34 may be formed using the same or a similar method as the methods for forming grooves disclosed herein. The formation of the groove 34 may also be monitored using the methods disclosed herein. As illustrated by FIG. 9, the sidewalls 36 of the groove 34 may be rough as a result of the laser ablation or the sawing. As illustrated by FIG. 10, the groove 34 is not entirely formed through the backside metal layer 30, thus leaving a portion 38 of the backside metal layer 30 in the die street 40.

Figure 11:
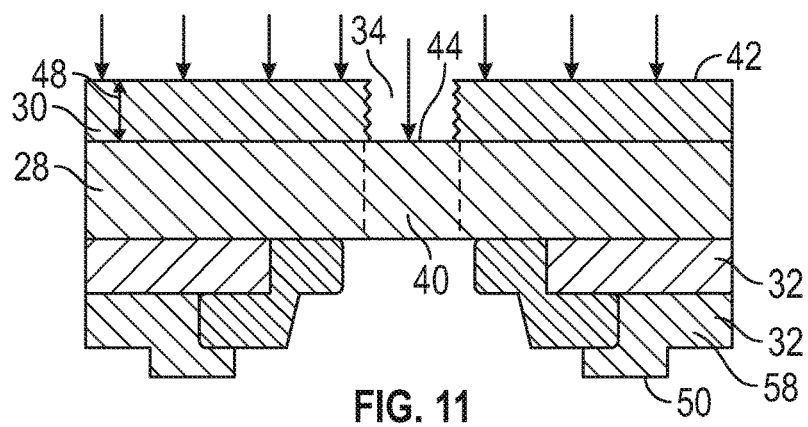
FIG. 11 is a view of the backside metal layer of FIG. 10 after the backside metal layer is thinned.

Referring to FIG. 11, a view of the backside metal layer of FIG. 10 after the backside metal layer is thinned is illustrated. In various implementations, the method of singulating a plurality of die may include etching the backside metal layer 30. The etch may be applied to the outer surface 42 of the backside metal layer 30 and within the groove 34 of the backside metal layer. In various implementations, the etch may expose a portion 44 of the substrate 28 in the die street 40. The etch may also thin the backside metal layer 30 to a second thickness 48. In particular implementations, referring to FIG. 10, prior to etching the first thickness of the backside metal layer may be about 15 µm thick. The groove 34 may be formed about 10 µm into the backside metal layer 30, leaving an about 5 µm thick portion 38. Upon etching the backside metal layer, as illustrated in FIG. 11, the backside metal layer 30 may be thinned to a second thickness of about 10 µm and the about 5 µm thick portion 38 that remained in the die street may be removed. In other implementations, the first thickness 46 of the backside metal layer 30 may be more or less than 15 µm thick. Similarly, the thickness of the portion 38 of the backside metal layer in the die street 40 may be more or less than 5 µm thick, and the second thickness 48 of the backside metal layer may be more or less than 10 µm thick. In various implementations, the etch applied to the backside metal layer 30 may be a wet etch, and may be sprayed onto the backside metal layer. In other implementations the wet etch may be applied using a technique aside from spraying. In various implementations, though not illustrated, tape or another layer may be applied to the front side, or outer surface 50 of the plurality of layers 32. The tape or other layer may protect the pads 58 of the plurality of die from the etch.

Figure 12:
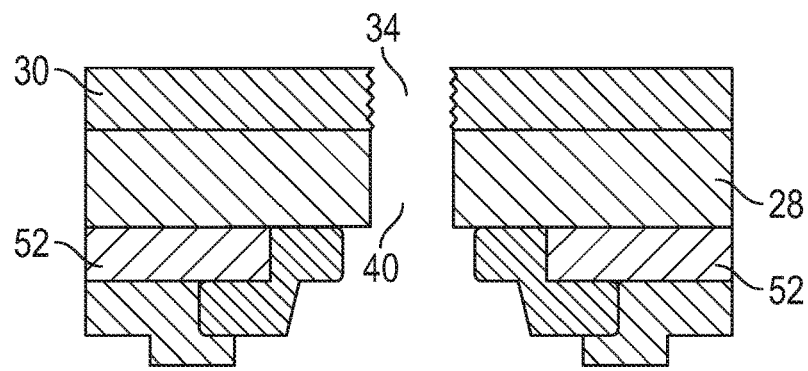
FIG. 12 is a view of the substrate of FIG. 9 singulated into a plurality of die.

Referring to FIG. 12, a view of the substrate of FIG. 9 singulated into a plurality of die is illustrated. In various implementations, the plurality of die 52 may be singulated through removing the substrate material of the substrate 28 in the die street 40. The substrate material may be removed through plasma etching at the portion of the substrate 28 exposed by the etching. In various implementations, a plasma etch process marketed under the tradename BOSCH® by Robert Bosch GmbH, Stuttgart Germany (the "Bosch process"), may be used to singulate the substrate 28 into a plurality of die 52. In other implementations, other plasma etch processes may be used to singulate the plurality of die 52 from the substrate 28. In various implementations, though not illustrated, singulating the plurality of die 52 included in the substrate 28 through plasma etching may include removing a portion of the substrate material of the substrate having a width less than a width of the die street, or groove. In such implementations, the width of the removed portion from plasma etching is less than the width of the die street as plasma die singulation is capable of creating a die street more narrow than the die street created through a laser beam or a saw. In other implementations, and as illustrated by FIG. 12, the width of the removed portion of substrate material may be the same as the width of the die street 40, or groove 34, by singulating the plurality of die 52 through removing through plasma etch all of the substrate material of the substrate 28 in the die street 40.

As illustrated by FIG. 12, the plurality of die 52 are singulated from the backside, or side opposite the plurality of die, of the substrate 28. Because of this, there is no need to flip the substrate over in order to singulate the substrate from the front side. The ability to singulate the plurality of die 52 from the backside may reduce damage to the substrate, and especially a thinned substrate, as it requires the substrate to be handled less and may increase the yield of the process. Further, in implementations disclosed herein where the backside metal layer is removed (or at least reduced) before singulation of the die, the risk of re-deposition of the backside metal layer may be reduced or eliminated.

In other implementations, rather than removing the substrate material in the die street 40 through plasma etching, removing the substrate material in the die street may be done using one of a laser beam or a saw blade. In such implementations, the laser beam or saw blade may result in roughened sidewalls of the die street or of the plurality of die. In such implementations, the method of singulating a plurality of die from the substrate may include remote plasma healing a sidewall of each die of the plurality of die. The remote plasma healing may be done using any method of remote plasma healing disclosed herein.

In various implementations, the method of singulating a plurality of die from a substrate may include depositing a diffusion barrier layer between the backside metal layer and the substrate. In such implementations, the diffusion barrier layer may serve as an etch stop when the portion of the backside metal layer in the die street is etched. The diffusion barrier layer may also prevent migration of the backside metal layer into the substrate during the etch. In implementations having a diffusion barrier layer, the portion of the diffusion barrier layer in the die street may be removed using a laser beam or a saw blade. In such implementations, the method of singulating a plurality of die from a substrate may include removing substrate material of the substrate in the die street using any method of removing substrate material disclosed herein.

In places where the description above refers to particular implementations of partial backside metal removal die singulation system and related methods and implementing components, sub-components, methods and sub-methods, it should be readily apparent that a number of modifications may be made without departing from the spirit thereof and that these implementations, implementing components, sub-components, methods and sub-methods may be applied to other partial backside metal removal die singulation system and related methods.

What is claimed is:

1. A method of singulating a plurality of die comprised in a substrate, the method comprising:
    forming a plurality of die on a first side of a substrate;
    forming a backside metal layer on a second side of the substrate;
    forming a groove only partially through a thickness of the backside metal layer, wherein the groove is located in a die street of the substrate; and
    singulating the plurality of die comprised in the substrate through removing backmetal material in the die street and removing substrate material in the die street.

2. The method of claim 1, further comprising thinning the second side of the substrate.

3. The method of claim 1, wherein the groove is formed using a laser beam.

4. The method of claim 1, wherein the groove is formed using a saw blade.

5. The method of claim 1, wherein removing backmetal material in the die street and removing substrate material in the die street further comprises using a laser beam.

6. The method of claim 1, wherein removing backmetal material in the die street and removing substrate material in the die street further comprises using a saw blade.

7. The method of claim 1, wherein singulating the plurality of die comprised in the substrate further comprises removing substrate material in the die street through plasma etching from the first side of the substrate and removing a remaining material of the thickness of the backside metal layer in the die street through jet ablation.

8. The method of claim 1, further comprising remote plasma healing a sidewall of a die.

9. The method of claim 1, further comprising monitoring a formation of a groove using a camera facing the second side of the substrate.

10. A method of singulating a plurality of die comprised in a substrate, the method comprising:
    forming a groove into a first thickness of a backside metal layer in a die street, the backside metal layer coupled to a substrate;
    etching the backside metal layer, wherein the etching exposes the substrate in the die street and thins the backside metal layer to a second thickness; and
    singulating a plurality of die comprised in the substrate through removing a substrate material in the die street.

11. The method of claim 10, further comprising depositing one of an adhesion layer, a diffusion barrier layer, or any combination thereof between the backside metal layer and the substrate.

12. The method of claim 11, wherein the one of the adhesion layer, the diffusion barrier layer, or any combination thereof serves as an etch stop.

13. The method of claim 10, wherein removing substrate material in the die street is done using one of a laser beam or a saw blade.

14. The method of claim 10, wherein removing substrate material in the die street further comprises plasma etching.

15. The method of claim 13, further comprising remote plasma healing a sidewall of each die of the plurality of die.

16. A method of singulating a plurality of die comprised in a substrate, the method comprising:
   forming a plurality of die on a first side of a substrate;
   forming a backside metal layer on a second side of a substrate;
   forming a groove partially through a first thickness of the backside metal layer in a die street;
   etching the backside metal layer, wherein the etching exposes a portion of the substrate in the die street and thins the backside metal layer to a second thickness; and
   singulating the plurality of die comprised in the substrate through plasma etching at the portion of the substrate exposed by the etching.

17. The method of claim 16, further comprising thinning the second side of the substrate, wherein the substrate is thinned to less than 50 micrometers.

18. The method of claim 16, wherein the backside metal layer is thinned to 10 micrometers.

19. The method of claim 16, wherein the groove is formed using a laser beam.

20. The method of claim 16, further comprising monitoring a formation of a groove using a camera facing the second side of the substrate.

* * * * *